(12) United States Patent
Kim

(10) Patent No.: US 9,179,559 B1
(45) Date of Patent: Nov. 3, 2015

(54) FOLDABLE DISPLAY APPARATUS

(71) Applicant: LG DISPLAY CO., LTD., Seoul (KR)

(72) Inventor: Yong Hee Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/570,953

(22) Filed: Dec. 15, 2014

(30) Foreign Application Priority Data

Sep. 1, 2014 (KR) .......................... 10-2014-0115741

(51) Int. Cl.
| | |
|---|---|
| *H05K 7/02* | (2006.01) |
| *H05K 7/04* | (2006.01) |
| *H05K 5/00* | (2006.01) |
| *H05K 7/00* | (2006.01) |
| *G06F 1/16* | (2006.01) |
| *H04M 1/00* | (2006.01) |
| *H05K 5/03* | (2006.01) |

(52) U.S. Cl.
CPC ............ *H05K 5/0017* (2013.01); *G06F 1/1641* (2013.01); *G06F 1/1647* (2013.01); *H05K 5/00* (2013.01); *H05K 5/0004* (2013.01); *H05K 7/02* (2013.01); *G06F 1/1633* (2013.01); *H05K 5/03* (2013.01)

(58) Field of Classification Search
CPC ....... G06F 1/1641; G06F 1/1647; H05K 5/00; H05K 7/02
USPC ............ 361/679.01, 679.04, 679.06, 679.27, 361/679.28, 809; 455/575.3, 566; 16/221
See application file for complete search history.

(56) References Cited

U.S. PATENT DOCUMENTS

| | | | |
|---|---|---|---|
| 2010/0227650 A1* | 9/2010 | Kim et al. ..................... | 455/566 |
| 2012/0264489 A1 | 10/2012 | Choi et al. | |
| 2013/0010405 A1* | 1/2013 | Rothkopf et al. ........ | 361/679.01 |

FOREIGN PATENT DOCUMENTS

EP 2728432 A1 5/2014

* cited by examiner

*Primary Examiner* — Courtney Smith
*Assistant Examiner* — Zhengfu Feng
(74) *Attorney, Agent, or Firm* — Birch, Stewart, Kolasch & Birch, LLP

(57) ABSTRACT

Discussed is a foldable display apparatus. The foldable display apparatus can include a display panel unfolded or folded at two stages with respect to first and second bending parts which are defined in a display area displaying an image, a first housing assembly configured to include a first panel supporting part which supports a central portion of the display panel between the first and second bending parts, a first connection housing connected to a first side of the first housing assembly to overlap the first bending part, a second connection housing connected to a second side of the first housing assembly to overlap the second bending part, a second housing assembly configured to support a first side of the display panel and connected to the first connection housing, and a third housing assembly configured to support a second side of the display panel and connected to the second connection housing.

11 Claims, 13 Drawing Sheets

FOLDABLE DISPLAY APPARATUS

CROSS-REFERENCE TO RELATED APPLICATIONS

This application claims the priority benefit of the Korean Patent Application No. 10-2014-0115741 filed on Sep. 1, 2014, which is hereby incorporated by reference as if fully set forth herein.

BACKGROUND OF THE INVENTION

1. Field of the Invention

The present invention relates to a foldable display apparatus, and more particularly, to a foldable display apparatus which is folded or unfolded with respect to a bending part defined in a display panel.

2. Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen is increasing, and thus, an apparatus including a display unit displaying a large screen is being developed and commercialized by connecting a flat display panel. In particular, foldable display apparatuses using the merits of a flexible display panel which is bendable or foldable provide portable convenience and include a display unit which displays a large screen. Thus the foldable display apparatuses are attracting much attention as the next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

Examples of the foldable display apparatuses may include a flexible display apparatus disclosed in U.S. Patent Publication No. 2013/0010405 (hereinafter referred to as a related art reference). The flexible display apparatus disclosed in the related art reference unfolds a flexible display with respect to a hinge having a link structure, thereby providing a large screen.

However, the flexible display apparatus disclosed in the prior art reference cannot stably maintain a bending curvature of a folded flexible display due to an empty space between housings caused by the hinge having the link structure, and cannot maintain a bending display area of an unfolded flexible display in a plane state.

SUMMARY OF THE INVENTION

Accordingly, the present invention is directed to provide a foldable display apparatus that substantially obviates one or more problems due to limitations and disadvantages of the related art.

An aspect of the present invention is directed to provide a foldable display apparatus which can maintain a bending part of an unfolded flexible display in a plane state.

Another aspect of the present invention is directed to provide a foldable display apparatus in which a display panel is folded at two stages.

Another aspect of the present invention is directed to provide a foldable display apparatus for minimizing a bending stress applied to a bending part of a display panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a foldable display apparatus including: a display panel unfolded or folded at two stages with respect to first and second bending parts which are defined in a display area displaying an image; a first housing assembly configured to include a first panel supporting part which supports a central portion of the display panel between the first and second bending parts; a first connection housing connected to a first side of the first housing assembly to overlap the first bending part; a second connection housing connected to a second side of the first housing assembly to overlap the second bending part; a second housing assembly configured to include a second panel supporting part which supports a first side of the display panel, and connected to the first connection housing; and a third housing assembly configured to include a third panel supporting part which supports a second side of the display panel, and connected to the second connection housing.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
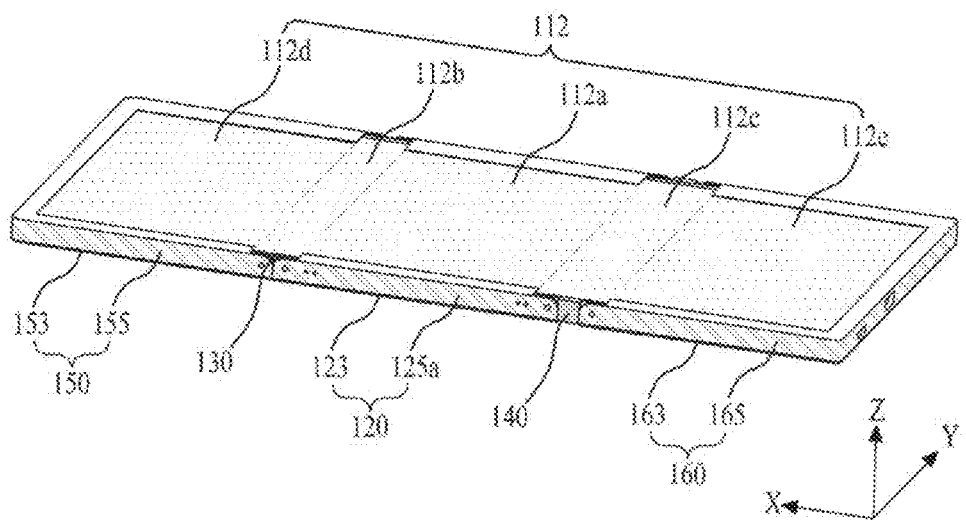
FIG. 1 is a perspective view illustrating a display panel which is unfolded to a plane state, in a foldable display apparatus according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a case where one element is formed at a top of another element and moreover a case where a third element is disposed therebetween.

Hereinafter, exemplary embodiments of a foldable display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
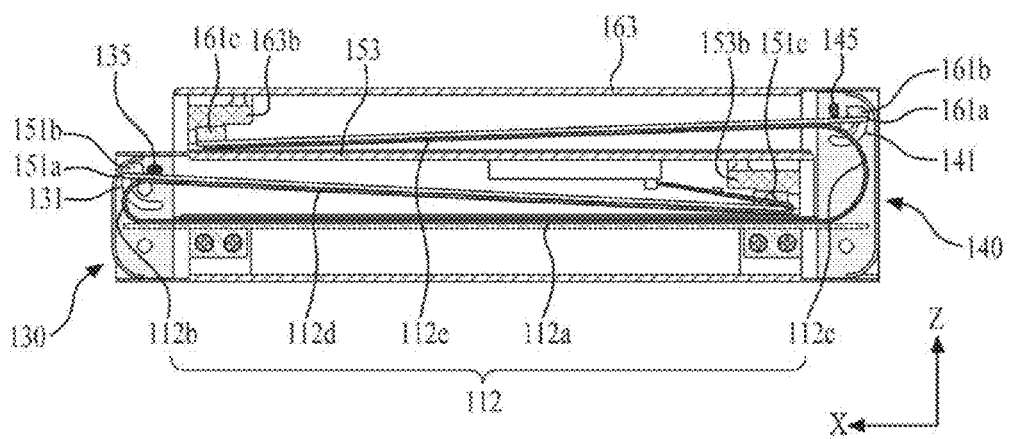
FIG. 2 is a cross-sectional view illustrating a display panel which is folded at two stages, in a foldable display apparatus according to an embodiment of the present invention.
Figure 3:
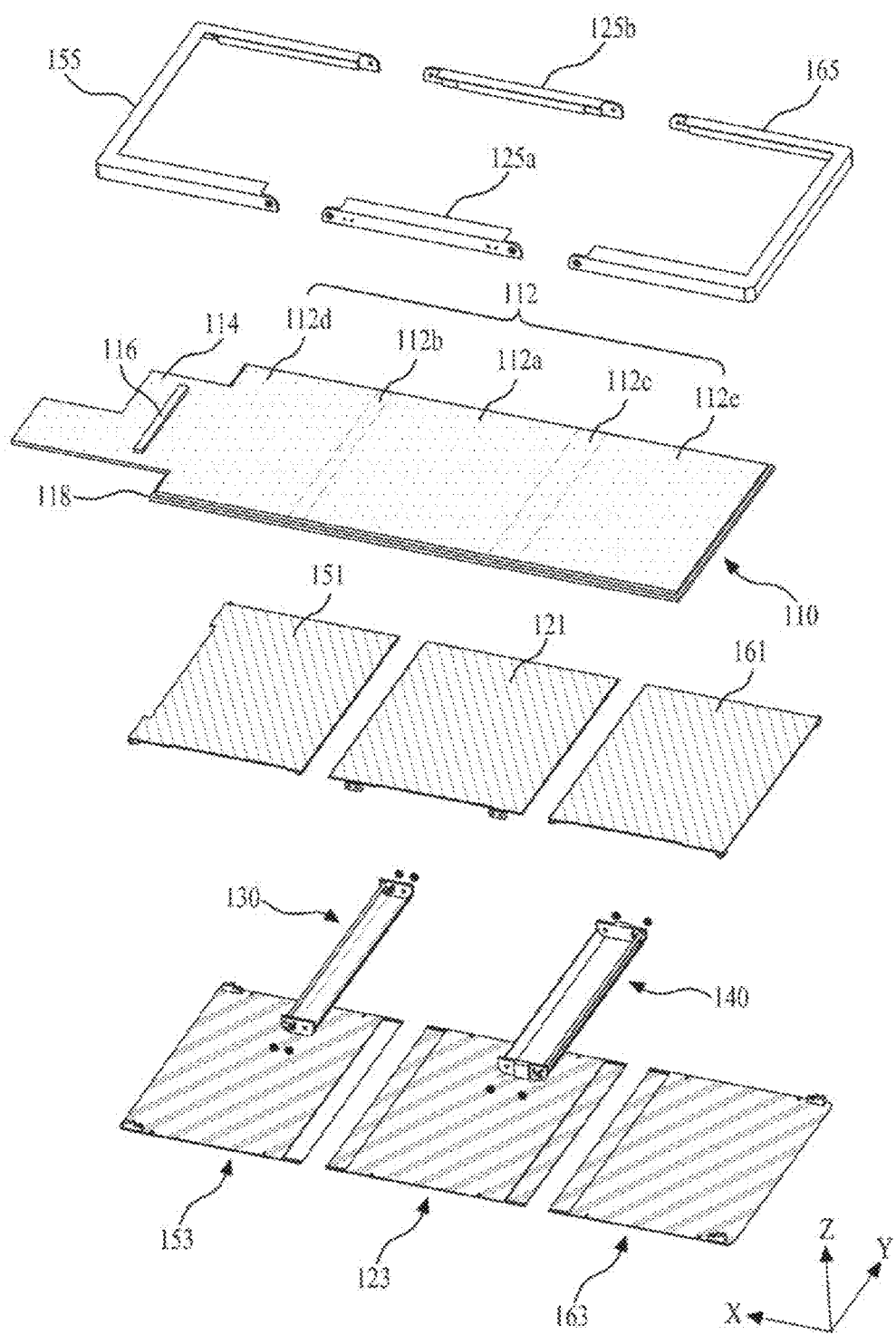
FIG. 3 is an exploded perspective view schematically illustrating the foldable display apparatus of FIG. 1.

FIG. 1 is a perspective view illustrating a display panel which is unfolded to a plane state, in a foldable display apparatus according to an embodiment of the present invention. FIG. 2 is a cross-sectional view illustrating a display panel which is folded at two stages, in a foldable display apparatus according to an embodiment of the present invention. FIG. 3 is an exploded perspective view schematically illustrating the foldable display apparatus of FIG. 1.

Referring to FIGS. 1 to 3, the foldable display apparatus according to an embodiment of the present invention includes a display panel 110, a first housing assembly 120, first and second connection housings 130 and 140, and second and third housing assemblies 150 and 160. In the foldable display apparatus having the configuration, the display panel 110 may be folded at two stages by folding the second and third housing assemblies 150 and 160, respectively connected to first and second sides of each of the first and second connection housings 130 and 140, onto the first housing assembly 120, or the display panel 110 may be unfolded to a plane state by unfolding the first and second connection housings 130 and 140 and the second and third housing assemblies 150 and 160 to a plane state.

The display panel 110 may be a flexible display panel using a flexible substrate. For example, the display panel 110 may be a flexible organic light emitting display panel, a flexible electrophoretic display panel, a flexible liquid crystal display panel, or a flexible electro-wetting display panel.

The display panel 110 includes a flexible substrate, which includes a pixel array including a plurality of pixels for displaying an image, and a cover member which is provided on a flexible substrate to cover the pixel array.

The flexible pixel array substrate may be formed of a plastic material. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

Each of the plurality of pixels includes a display device that displays an image corresponding to an image signal. Here, the display device may be an organic light emitting device, a liquid crystal display device, an electrophoretic device, or an electro-wetting display device.

When the display device is the organic light emitting device or the electrophoretic device, the cover member according to an embodiment is formed on a flexible substrate to cover a pixel array, and may be a flexible encapsulating substrate or an encapsulating layer. When the display device is the liquid crystal display device, the electro-wetting display device, or the electrophoretic device, a cover member according to another embodiment may be a flexible color filter substrate that includes a color filter corresponding to a pixel.

In addition, the display panel 100 may further include a polarizing film attached to the cover member, but the polarizing film may be omitted for a flexibility of the display panel 110.

The foldable display apparatus according to an embodiment of the present invention may further include a touch screen for a user interface using a user's touch. The touch screen may be attached onto the display panel 110, or may be built into the display panel 110 at the same with a process of forming the pixel array.

The display panel 110 includes a display area 112 including the plurality of pixels. The display area 112 may become a display screen that displays a certain image according to driving of a panel driver. The display area 112 may be divided into a central area 112a, first and second bending parts 112b and 112c, and first and second areas 112d and 112e.

The central area 112a is a central portion of the display area 112, and may be defined as a central portion of the display panel 110 which is an area between the first and second bending parts 112b and 112c. When the display panel 110 is folded, the central area 112a may be always maintained in a plane state (or a horizontal state) without being folded.

The first bending part 112b is an area which is adjacent to and parallel to a first side of the central area 112a in the display area 112, and may be defined as a one-stage-folded area of the display panel 110. When the display panel 110 is unfolded, the first bending part 112b is unfolded to a plane state between the central area 112a and the first area 112d. The first bending part 112b is bent in a curved shape having a first curvature between the central area 112a and the first area 112d so that the central area 112a directly faces the first area 112d when the display panel 110 is folded.

The second bending part 112c is an area which is adjacent to and parallel to a second side of the central area 112a in the display area 112, and may be defined as a two-stage-folded area of the display panel 110. When the display panel 110 is unfolded, the second bending part 112c is unfolded to a plane state between the central area 112a and the second area 112e. The second bending part 112c is bent in a curved shape, having a second curvature greater than the first curvature, between the central area 112a and the second area 112e so that the central area 112a directly faces the second area 112e when the display panel 110 is folded.

The first area 112d is defined as an area between the first bending part 112b of the display area 112 and one short side of the display panel 110, and may be an upper area of the display area 112. When the display panel 110 is folded, the first area 112d may be always maintained in a plane state (or a horizontal state) without being folded.

The second area 112e is defined as an area between the second bending part 112c of the display area 112 and the other short side of the display panel 110, and may be a lower area of the display area 112. When the display panel 110 is folded, the second area 112e may be always maintained in a plane state (or a horizontal state) without being folded.

The display panel 110 includes a signal applying unit 114 that extends from an edge of the first area 112d to have a certain width and length. A plurality of link lines, connected to a signal line provided in the pixel array, are provided in the signal applying unit 114. The signal applying unit 114 is bent toward a rear surface of a second panel supporting part to surround a second side of the first panel supporting part configuring the below-described second housing assembly 120, and is connected to a system driver (not shown) which is disposed on a second lower housing. A driving integrated circuit (IC) 116, which drives a pixel provided in the display area 112 on the basis of a pixel driving signal and a data signal which are provided from the system driver, is mounted on the signal applying unit 114.

The display panel 110 may be attached to a flexible supporting plate 118. The flexible supporting plate 118 is attached to an entire rear surface of the display panel 110, and maintains the display panel 110, which is flexible, in a flat state. The flexible supporting plate 118 may be omitted depending on a flexible characteristic of a flexible substrate.

Figure 4:
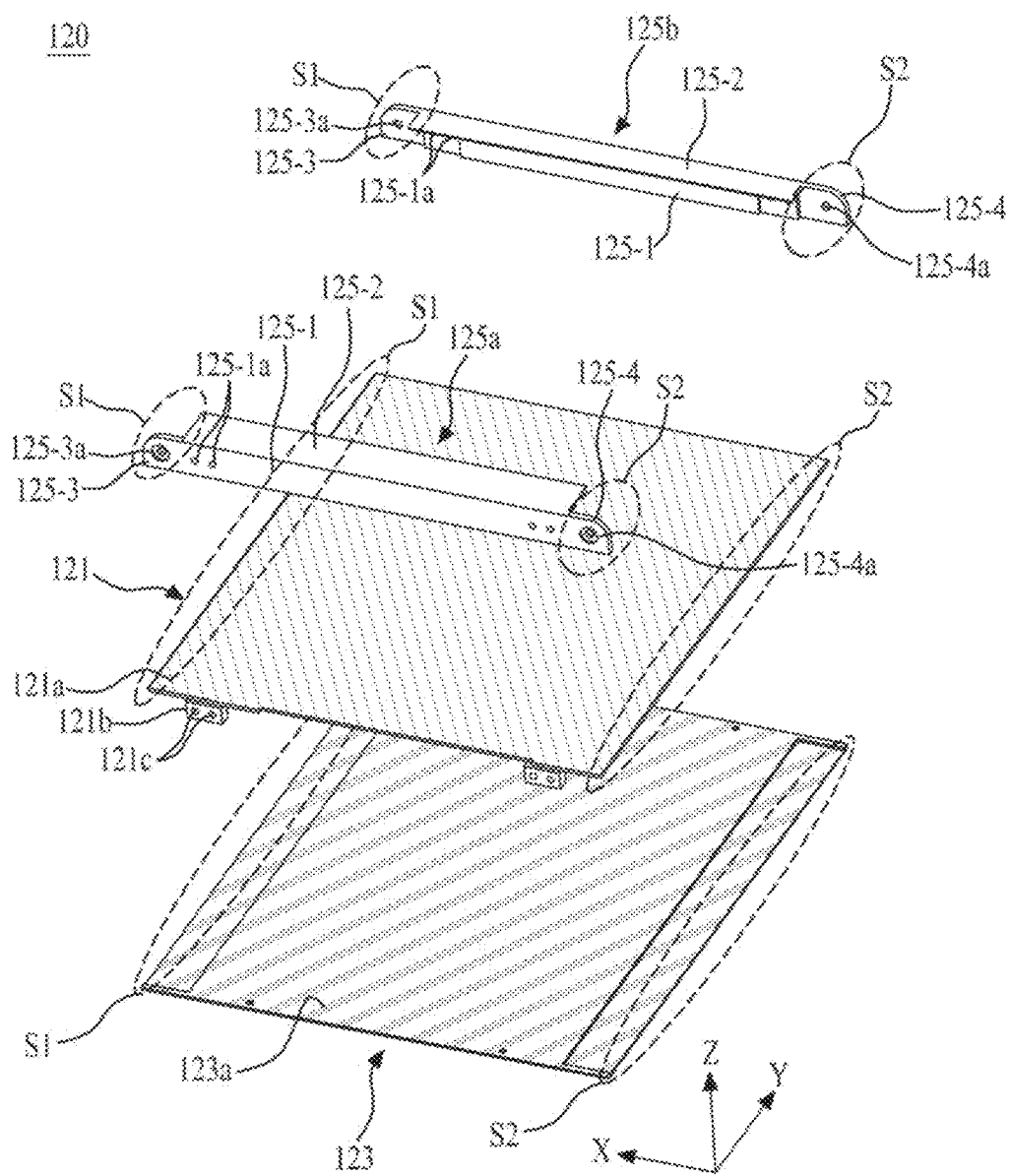
FIG. 4 is an exploded perspective view schematically illustrating a first housing assembly of FIGS. 1 and 3.

The first housing assembly 120 supports a central portion of the display panel 100 which is an area between the first and second bending parts 112b and 112c. The first housing assembly 120 according to an embodiment, as illustrated in FIGS. 3 and 4, may include a first panel supporting part 121, a first lower housing 123, and a pair of first upper housings 125a and 125b.

The first panel supporting part 121 includes a first plate 121a, a first coupling part 121b, and a pair of first coupling holes 121c.

The first plate 121a may be provided in a plate shape, and may be physically coupled to a central rear surface of the display panel 110 by a panel adhesive member. In this case, when the display panel 110 is folded, a first side S1 of the first plate 121a is not coupled to the display panel 110 for smooth bending of the first bending part 112b, and when the display panel 110 is unfolded, the first side S1 supports a first side of the bending part 112b in a plane state. Also, when the display panel 110 is folded, a second side S2 of the first plate 121a is not coupled to the display panel 110 for smooth bending of the first bending part 112b, and when the display panel 110 is unfolded, the second side S2 supports the first side of the bending part 112b in a plane state.

The first coupling part 121b is provided at a bottom of the first plate 121a adjacent to each of the first and second sides of the first plate 121a to have a certain height. The first coupling part 121b is supported by the first lower housing 123.

The pair of first coupling holes 121c are provided at the first coupling part 121b, and may be screw holes.

The first lower housing 123 may include a first lower cover 123a. The first lower cover 123a is provided in a plate shape, and covers a rear surface of the first panel supporting part 121, a first side of the first connection housing 130, and a first side of the second connection housing 140.

Each of the pair of first upper housings 125a and 15b is coupled to the first lower cover 123a and the first plate 121, and covers central both edges of the display panel 110 except the first and second bending parts 112b and 112c. Here, a first side S1 of each of the pair of first upper housings 125a and 125b is rotatably coupled to the first side of the first connection housing 130, and a second side S2 of each of the pair of first upper housings 125a and 125b is rotatably coupled to a first side of the second connection housing 140.

Each of the pair of first upper housings 125a and 125b according to an embodiment may include a side cover 125-1, a front cover 125-2, a first extending part 125-3, and a second extending part 125-4.

The side cover 125-1 and the front cover 125-2 are provided to have a ]-shaped cross-sectional surface and to cover central both edges of the display panel 110 and both sides of the first panel supporting part 121.

The side cover 125-1 is provided in a —-shape to cover a side of the first panel supporting part 121. The side cover 125-1 is coupled to the first coupling part 121b by a pair of screw holes 125-1a coupled to a pair of coupling holes 121c which are provided at the first coupling part 121b. Therefore, both sides of the first panel supporting part 121 are coupled to and covered by a side cover 125-1 of each of the pair of first upper housings 125a and 125b with respect to a length direction X of the display panel 110.

The front cover 125-2 is bent from on the side cover 125-1 to be parallel to the display area 112 of the display panel 110, and covers central both edges of the display panel 110 except the first and second bending parts 112b and 112c.

The first extending part 125-3 is provided to extend, by a certain length, from a first side S1 of the side cover 125-1 along a length direction X of the display panel 110. The first side of the first connection housing 130 is rotatably connected to the first extending part 125-3. A first shaft through hole 125-3a is provided at the first extending part 125-3.

The second extending part 125-4 is provided to extend, by a certain length, from a second side S2 of the side cover 125-1 along the length direction X of the display panel 110. A first side of the second connection housing 140 is rotatably connected to the second extending part 125-4. A second shaft through hole 125-4a is provided at the second extending part 125-4.

Figure 5:
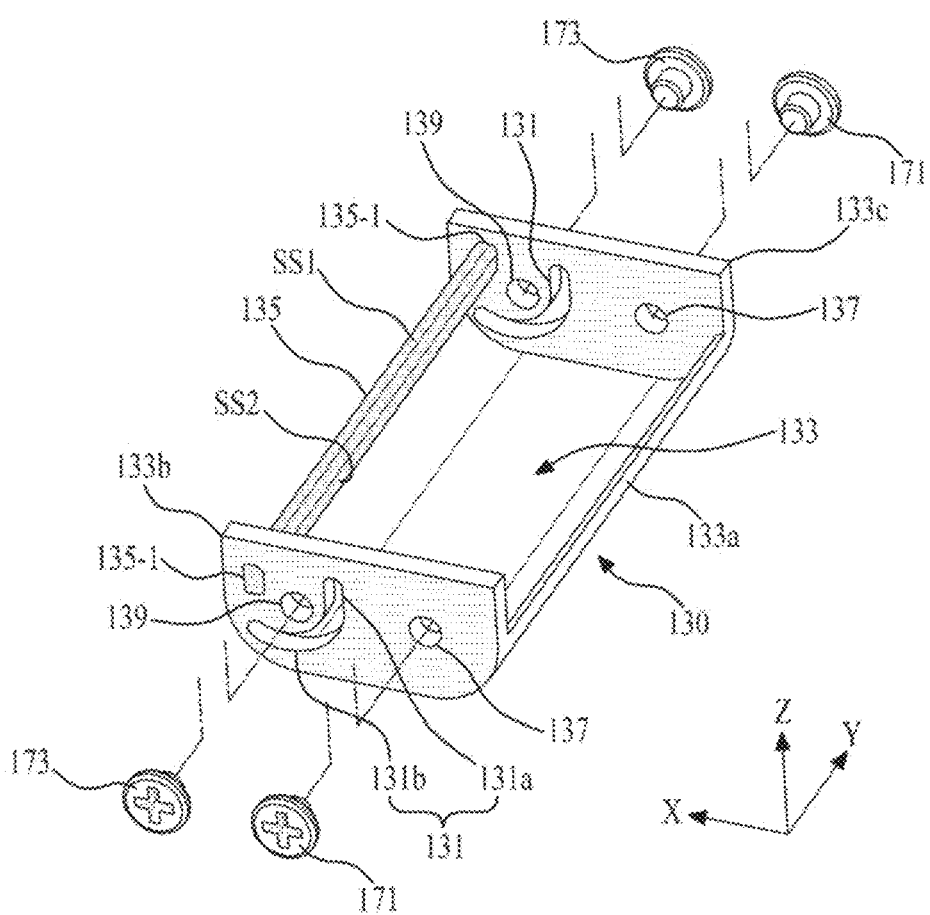
FIG. 5 is an exploded perspective view schematically illustrating a first connection housing of FIGS. 1 and 3.

Referring again to FIGS. 1 to 3, the first connection housing 130 is rotatably connected to a first side S1 of the first housing assembly 120 to overlap the first bending part 112b. The first connection housing 130 rotates within a range from 0 degrees to 90 degrees with the first side S1 of the first housing assembly 120 as a rotation axis, and rotatably supports the second housing assembly 150. The first connection housing 130 according to an embodiment, as illustrated in FIG. 5, includes a first slot 131 and a first accommodating part 133.

The first slot 131 is provided at a second side of the first connection housing 130, and guides a first side S1 of the second housing assembly 150 so as to be moved between a supporting position and an avoiding position. Also, when a first side of the display panel 110 is folded or unfolded with respect to the first bending part 112b, the first slot 131 enables the first side to be moved by a certain distance in the length direction X of the display panel 110.

The first slot 131 according to an embodiment may include a vertical slot 131a, which is provided along a vertical direction Z vertical to the length direction X of the display panel 110, and a curved slot 131b which is connected to the vertical slot 131a in a curved shape.

The vertical slot 131a is for moving the first side of the display panel 110 by a certain distance in the length direction X of the display panel 110. That is, when the first bending part 112b is bent in a curved shape or is unfolded to a plane state, the vertical slot 131a slides the first side of the display panel 110, thereby reducing or dispersing a bending stress applied to the first bending part 112b which is bent at a relatively small curvature.

The curved slot 131b is for bending the first bending part 112b at a predetermined curvature, and guides a rotation trajectory of the second housing assembly 150.

The first slot 131 according to an embodiment may be wholly provided in a curved shape along the rotation trajectory of the second housing assembly 150. However, as described above, the first slot 131 may include the vertical slot 131a, for reducing or dispersing a bending stress applied to the first bending part 112b.

The first accommodating part 133 enables the first side S1 of the second housing assembly 150 to be moved between the supporting position and the avoiding position, and accommodates the first bending part 112b which is bent in a curved shape. The first accommodating part 133 according to an embodiment includes a first floor cover 133a, a first side wall 133b, and a second side wall 133c.

The first floor cover 133a overlaps the first bending part 112b of the display panel 110, and both edges of the first floor cover 133a in a length direction Y is rounded to have a certain curvature.

The first side wall 133b is vertically provided at one short side of the first floor cover 133a. The second slot 141 is provided at a second side of the first side wall 133b. The second side wall 133c is vertically provided at the other short side of the first floor cover 133a in parallel with the first side wall 133b. The first slot 131 is provided at a second side of the second side wall 133c.

The first connection housing 130 according to an embodiment further includes a first supporting member 135.

The first supporting member 135 supports a first side S1 of the second housing assembly 150 which is moved along the first slot 131.

The first supporting member 135 according to an embodiment is provided in a bar shape which is spanned between first and second side walls 133b and 133c, and has first and second supporting surfaces SS1 and SS2.

Each of the first and second supporting surfaces SS1 and SS2 acts as a support that supports the first side S1 of the second housing assembly 150, and enables the first side S1 of the second housing assembly 150 to be slid between a supporting position and an avoiding position according to guide by the first slot 131. That is, the first supporting surface SS1 may be a top of the first supporting member 135. The first supporting surface SS1 act as a support that supports the first side S1 of the second housing assembly 150 which is moved to the supporting position along the first slot 131, and thus maintains the second housing assembly 150, moved to the supporting position, in a horizontal state. The second supporting surface SS2 may support an inner surface of the first supporting member 135 facing the first housing assembly 120. The second supporting surface SS2 guides the first side S1 of the second housing assembly 150, which is moved to the avoiding position along the first slot 131, so as to smoothly rotate.

A plurality of first bar inserting holes 135-1, into which both ends of the first supporting member 135 are respectively inserted, are respectively provided at the first and second side walls 133b and 133c.

Figure 6:
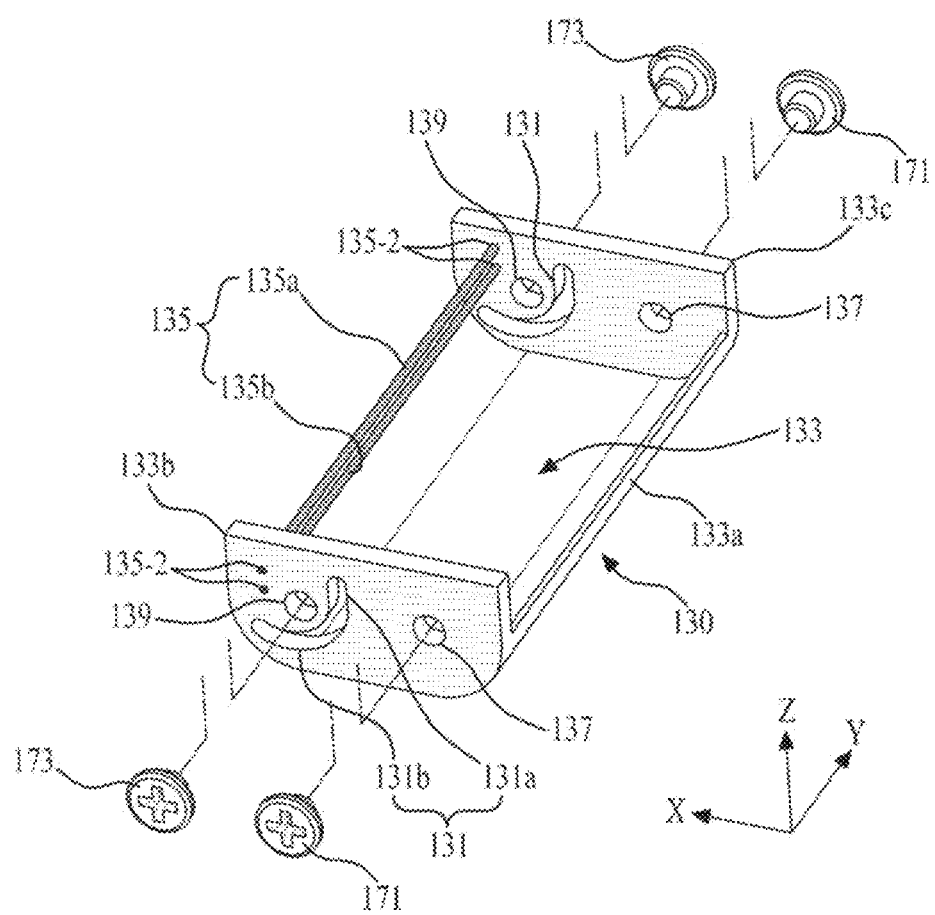
FIG. 6 is a perspective view for describing a modification example of a first supporting member in the first connection housing of FIG. 5.

A first supporting member 135 according to another embodiment, as illustrated in FIG. 6, may include first and second supporting bars 135a and 135b which are spanned between the first and second side walls 133b and 133c. Each of the first and second supporting bars 135a and 135b acts as a support that supports the first side S1 of the second housing assembly 150, and enables the first side S1 of the second housing assembly 150 to be slid between the supporting position and the avoiding position according to guide by the first slot 131. That is, the first supporting bar 135a supports the first side S1 of the second housing assembly 150 which is moved to the supporting position along the first slot 131. The second supporting bar 135b guides the first side S1 of the second housing assembly 150, which is moved to the avoiding position along the first slot 131, so as to smoothly rotate. A pair of bar inserting holes 135-2, into which both ends of each of the first and second supporting bars 135a and 135b are respectively inserted, are respectively provided at each of the first and second side walls 133b and 133c.

The first connection housing 130 according to an embodiment, as illustrated in FIGS. 5 and 6, further includes first and second shaft coupling parts 137 and 139.

The first shaft coupling part 137 is provided at a first side of each of the first and second side walls 133b and 133c adjacent to the first side S1 of the first housing assembly 120. The first shaft coupling part 137 is coupled to a first pivot shaft 171 that passes through a first shaft through hole 125-3a (see FIG. 4) of the first housing assembly 120. Therefore, the first connection housing 130 rotates by 0 degrees to 90 degrees from the first side S1 of the first housing assembly 120 with the first pivot shaft 171, coupled to the first shaft coupling part 137, as a rotation axis.

The second shaft coupling part 139 is provided at a second side of each of the first and second side walls 133b and 133c adjacent to the first side S1 of the second housing assembly 150. That is, the second shaft coupling part 139 is provided between the first bar inserting hole 135-1 (or the pair of bar inserting holes 135-2) and the first slot 131. The second shaft coupling part 139 is coupled to a second pivot shaft 173 that passes through the first side S1 of the second housing assembly 150. Therefore, the first side S1 of the second housing assembly 150 may rotate onto the first housing assembly 120 with the second pivot shaft 173, coupled to the second shaft coupling part 139, as a rotation axis.

Figure 7:
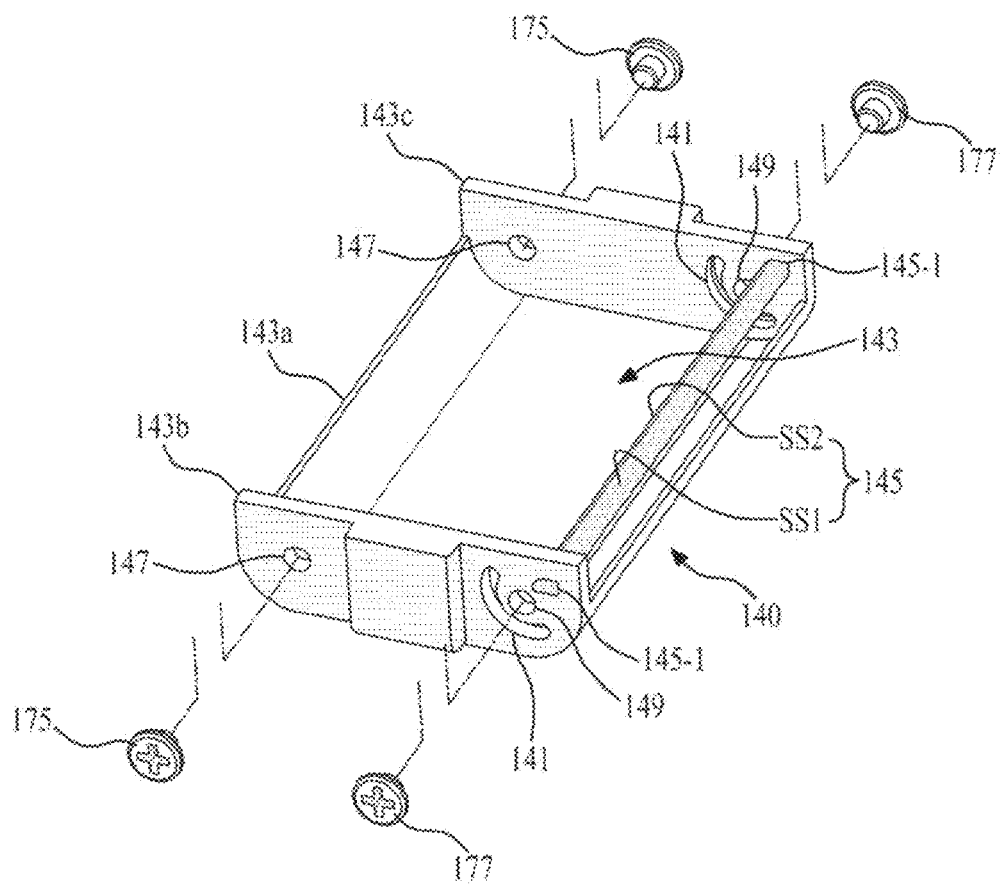
FIG. 7 is an exploded perspective view schematically illustrating a second connection housing of FIGS. 1 and 3.

Referring again to FIGS. 1 to 3, the second connection housing 140 is rotatably connected to a second side S2 of the first housing assembly 120 to overlap the second bending part 112c. The second connection housing 140 rotates within a range from 0 degrees to 90 degrees with the second side S2 of the first housing assembly 120 as a rotation axis, and rotatably supports the third housing assembly 160. The second connection housing 140 according to an embodiment, as illustrated in FIG. 7, includes a second slot 141 and a second accommodating part 143.

The second slot 141 is provided at a second side of the second connection housing 140, and guides a first side S1 of the third housing assembly 160 so as to be moved between a supporting position and an avoiding position.

The second slot 141 according to an embodiment is provided in a curved shape to have a predetermined curvature, and is for bending the second bending part 112c, and guides a rotation trajectory of the third housing assembly 160.

The second accommodating part 143 enables a first side S1 of the third housing assembly 160 to be moved between a supporting position and an avoiding position, and accommodates the second bending part 112c which is bent in a curved shape. The second accommodating part 143 according to an embodiment includes a second floor cover 143a, a third side wall 143b, and a fourth side wall 143c.

The second floor cover 143a overlaps the second bending part 112c of the display panel 110, and both edges of the second floor cover 143a in the length direction Y is rounded to have a certain curvature.

The third side wall 143b is vertically provided at one short side of the second floor cover 143a. The second slot 141 is provided at a second side of the third side wall 143b. The fourth side wall 143c is vertically provided at the other short side of the second floor cover 143a in parallel with the third side wall 143b. The second slot 141 is provided at a second side of the fourth side wall 143c.

The second connection housing 140 according to an embodiment further includes a second supporting member 145.

The second supporting member 145 supports a first side S1 of the third housing assembly 160 which is moved along the second slot 141.

The second supporting member 145 according to an embodiment is provided in a bar shape which is spanned between third and fourth side walls 143b and 143c, and has first and second supporting surfaces SS1 and SS2.

Each of the first and second supporting surfaces SS1 and SS2 acts as a support that supports the first side S1 of the third housing assembly 160, and enables the first side S1 of the third housing assembly 160 to be slid between a supporting position and an avoiding position according to guide by the second slot 141. That is, the first supporting surface SS1 may be a top of the first supporting member 135. The first supporting surface SS1 may be a top of the second supporting member 145. The first supporting surface SS1 act as a support that supports the first side S1 of the third housing assembly 160 which is moved to the supporting position along the second slot 141, and thus maintains the third housing assembly 160, moved to the supporting position, in a horizontal state. The second supporting surface SS2 may be an inner surface of the second supporting member 145 facing the first housing assembly 120. The second supporting surface SS2 guides the first side S1 of the third housing assembly 160, which is moved to the avoiding position along the second slot 141, so as to smoothly rotate. A plurality of second bar inserting holes 145-1, into which both ends of the second supporting member 145 are respectively inserted, are respectively provided at the third and fourth side walls 143b and 143c.

A second supporting member 145 according to another embodiment may include first and second supporting bars (not shown) like the first supporting member 135 according to another embodiment. Each of the first and second supporting bars is spanned between the third and fourth side walls 143b and 143c, acts as a support that supports the first side S1 of the third housing assembly 160, and enables the first side S1 of the third housing assembly 160 to be slid between the supporting position and the avoiding position according to guide by the second slot 141. That is, the first supporting bar supports the first side S1 of the third housing assembly 160 which is moved to the supporting position along the second slot 141. The second supporting bar guides the first side S1 of the third housing assembly 160, which is moved to the avoiding position along the second slot 141, so as to smoothly rotate. A pair of bar inserting holes (not shown), into which both ends of each of the first and second supporting bars are respectively inserted, are respectively provided at each of the third and fourth side walls 143b and 143c.

The second connection housing 140 according to an embodiment further includes third and fourth shaft coupling parts 147 and 149.

The third shaft coupling part 147 is provided at a first side of each of the first and second side walls 133b and 133c adjacent to the second side S2 of the first housing assembly 120. The third shaft coupling part 147 is coupled to a third pivot shaft 175 that passes through a second shaft through hole 125-4a (see FIG. 4) of the first housing assembly 120. Therefore, the second connection housing 140 rotates by 0 degrees to 90 degrees from the second side S2 of the first housing assembly 120 with the third pivot shaft 175, coupled to the third shaft coupling part 147, as a rotation axis.

The fourth shaft coupling part 149 is provided at a second side of each of the third and fourth side walls 143b and 143c adjacent to the first side S1 of the third housing assembly 160. That is, the fourth shaft coupling part 149 is provided between the second bar inserting hole 145-1 and the second slot 141. The fourth shaft coupling part 149 is coupled to a fourth pivot shaft 177 that passes through the first side S1 of the third housing assembly 160. Therefore, the first side S1 of the third housing assembly 160 may rotate onto the second housing assembly 150 with the fourth pivot shaft 177, coupled to the fourth shaft coupling part 149, as a rotation axis.

Figure 8:
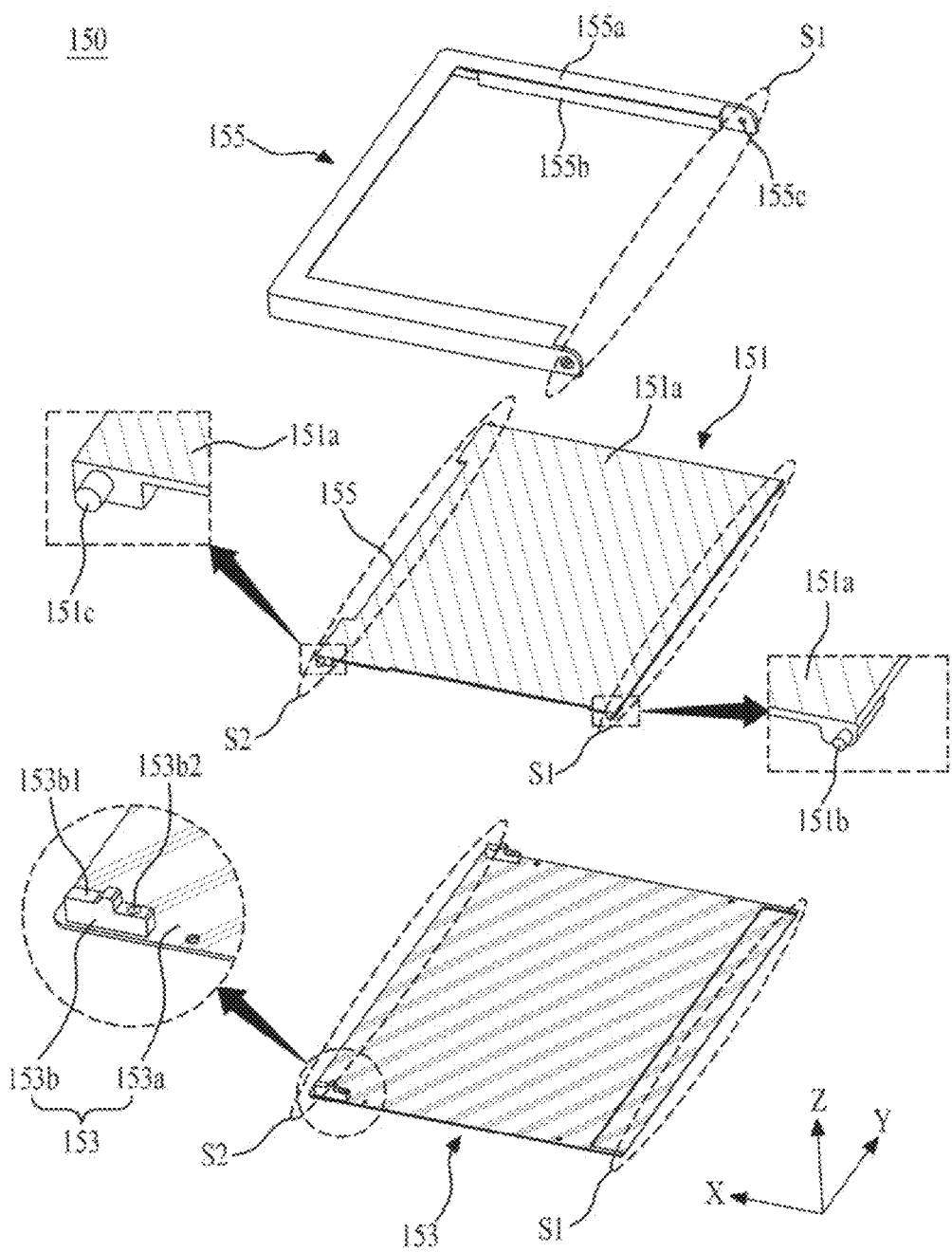
FIG. 8 is an exploded perspective view schematically illustrating a second housing assembly of FIGS. 1 and 3.

Referring again to FIGS. 1 to 3, the second housing assembly 150 includes a second panel supporting part 151 that supports the first side of the display panel 110, and is rotatably coupled to the first side of the first connection housing 130. When the display panel 110 is folded with respect to the first bending part 112b, the second housing assembly 150 rotates from the second side of the first connection housing 130 onto the first housing assembly 120 to overlap the first housing assembly 120. The second housing assembly 150 according to an embodiment, as illustrated in FIG. 8, may include a second panel supporting part 151, a second lower housing 153, and a second upper housing 155.

The second panel supporting part 151 supports a first area 112d of the display panel 110. A first side S1 of the second panel supporting part 151 is rotatably supported by the second lower housing 153 while moving, and a second side S2 parallel to the first side S1 is movably coupled to the first connection housing 130, and when the display panel 110 is unfolded, the second side S2 supports a second side of the first bending part 112b. The second panel supporting part 151 according to an embodiment includes a second plate 151a, a pair of first moving shafts 151b, and a pair of first rotation shafts 151c.

The second plate 151a is coupled to a first area (i.e., a first rear area) of the display panel 110, and overlaps the second side of the first bending part 112b. Here, a partial area of the second plate 151a overlapping the first rear area of the display panel 110 is physically coupled to the first rear area of the display panel 110 by an adhesive member (not shown). The other area of the second plate 151a overlapping the second side of the first bending part 112b is not physically coupled to the display panel 110 for bending of the first bending part 112b, and when the display panel 110 is unfolded, the other area of the second plate 151a supports the second side of the first bending part 112b.

A film bending part 155, which is recessed to have a certain size, is provided at a second side S2 of the second plate 151a.

The signal applying unit 114 of the display panel 110 is bent to a rear surface of the second plate 151a through the film bending part 155.

Figure 9:
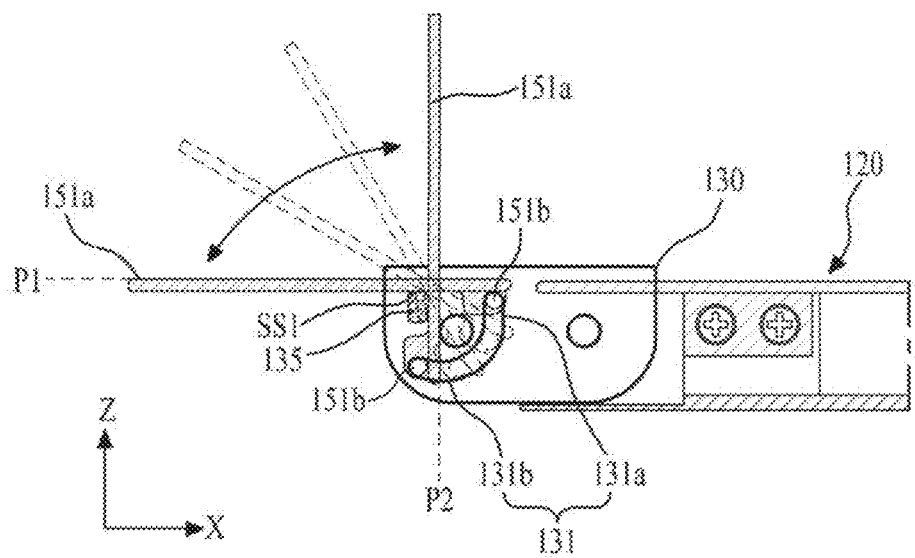
FIG. 9 is a diagram illustrating moving of a second plate by a first slot in the second housing assembly of FIG. 8.

The pair of first moving shafts 151b may protrude from a first side S1 of the second plate 151a (more particularly, a first side edge of a long side of the second plate 151a adjacent to the first connection housing 130) to have a certain length, and thus may be provided in a cylindrical shape. Each of the pair of first moving shafts 151b, as illustrated in FIG. 9, is movably inserted into the first slot 131 of the first connection housing 130. Each of the pair of first moving shafts 151b is slid in the first slot 131 according to rotation of the second housing assembly 150, and moves the first side S1 of the second plate 151a to a supporting position P1 or an avoiding position P2.

The pair of first rotation shafts 151c may protrude from a second side S1 of the second plate 151a (more particularly, a second side edge of the long side of the second plate 151a) to have a certain length, and thus may be provided in a cylindrical shape.

The first moving shaft 151b and the first rotation shaft 151c are not provided to protrude from the second plate 151a, and may be separate shaft members such as a pin or a shaft coupled to an edge of a long side of a corresponding second plate 151a.

When the display panel 110 is unfolded and folded, the second panel supporting part 151 swings with respect to the first rotation shaft 151c, and thus, a first side S1 of the second panel supporting part 151 is moved to a supporting position for supporting the second side of the first bending part 112b according to sliding of the first moving shaft 151b based on the movement guide of the first slot 131 which is provided at the first connection housing 130, or is moved to an avoiding position in order for the first bending part 112b to be bent in a curved shape.

The second lower housing 153 rotatably supports the second side S2 of the second panel supporting part 151, and covers a bottom of the second panel supporting part 151. The second lower housing 153 according to an embodiment includes a second lower cover 153a and a pair of first shaft supporting bodies 153b.

The second lower cover 153a is coupled to the second upper housing 155 by a coupling member such as a screw, and covers a bottom of the second panel supporting part 151 and the second side of the first connection housing 130.

Each of the pair of first shaft supporting bodies 153b is coupled to a second side edge of the second lower cover 153a in parallel to overlap a corresponding first rotation shaft 151c which is provided at the second panel supporting part 151, and movably supports the corresponding first rotation shaft 151c. Each of the pair of first shaft supporting bodies 153b according to an embodiment includes a first shaft supporting groove 153b1 which supports the first rotation shaft 151c so as to move while rotating when the first moving shaft 151b of the second panel supporting part 151 moves in the vertical slot 131a of the first slot 131. Here, the first shaft supporting groove 153b1 includes a movement guide surface which is provided to have a certain length with respect to a moving direction X of the first rotation shaft 151c. The pair of first shaft supporting bodies 153b are coupled to the second lower cover 153a by a coupling member (not shown) such as a screw coupled to the second lower cover 153a through a first coupling hole 153b2 which is provided adjacent to the first shaft supporting groove 153b1. Each of the pair of first shaft supporting bodies 153b supports the first rotation shaft 151c so as to move while rotating, and thus, the second panel supporting part 151 is slid along a trajectory of the first slot 131, thereby reducing or dispersing a stress applied to the first area of the display panel 110, namely, the first bending part 112b.

The second upper housing 155 is coupled to the second lower housing 153, is rotatably coupled to a second side of the first connection housing 130, and covers an edge of the first area of the display panel 110 except the first bending part 112b. That is, the second upper housing 155 has a ⌈-shaped cross-sectional surface which includes a front cover part 155a and a side cover part 155b, has a ⊂-shape in plane, and surrounds a side of the second panel supporting part 151 and a peripheral area of the first area of the display panel 110 except the first bending part 112b.

A first side S1 of the second upper housing 155 is rotatably coupled to a second shaft coupling part 139 (see FIG. 5 or 6), which is provided at the second side of the first connection housing 130, by the second pivot shaft 173 (see FIG. 5 or 6). To this end, a first shaft inserting hole 155c is provided at the first side S1 of the second upper housing 155. A plurality of screw holes, which are coupled to a coupling member such as a screw passing through the second lower cover 153a of the second lower housing 153, can be arranged at certain intervals at a bottom of the side cover part 155b of the second upper housing 155. Therefore, the second upper housing 155 may rotate by 0 degrees to 90 degrees from the second side of the first connection housing 130 with respect to the second pivot shaft 173. In addition, the second upper housing 155 covers an upper portion of the first rotation shaft 151c supported by the first shaft supporting body 153b, and thus prevents the first rotation shaft 151c from deviating from the first shaft supporting body 153b.

As the first side S1 of the second panel supporting part 151 is supported by the first supporting member 135, a space is provided between the second lower housing 153 and the second panel supporting part 151, and may be used as an accommodating space in which a driving system, various circuits, and a battery which are used to drive the display panel 110 are accommodated.

Figure 10:
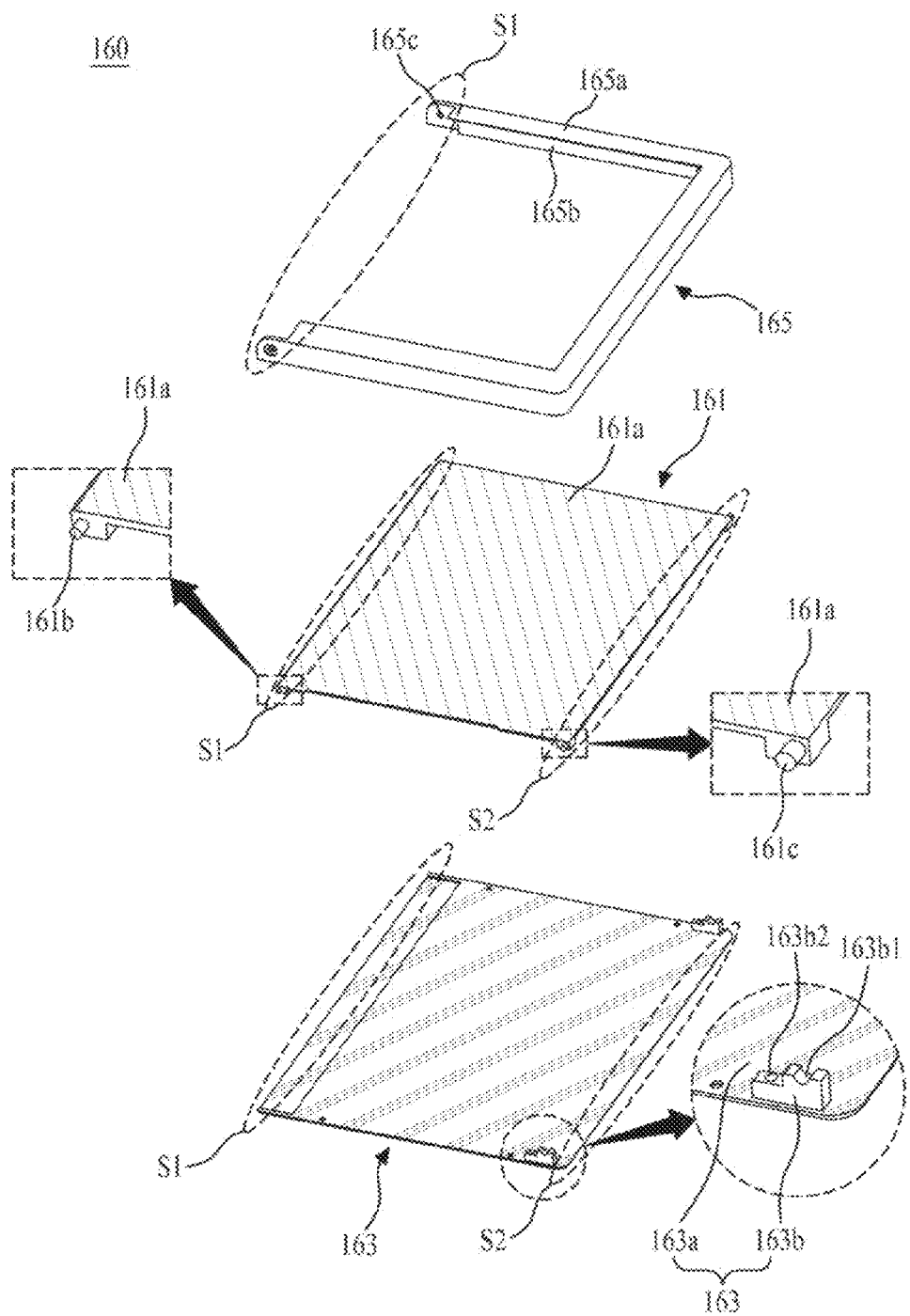
FIG. 10 is an exploded perspective view schematically illustrating a third housing assembly of FIGS. 1 and 3.

Referring again to FIGS. 1 to 3, the third housing assembly 160 includes a third panel supporting part 161 that supports the second side of the display panel 110, and is rotatably coupled to the second side of the second connection housing 140. When the display panel 110 is folded with respect to the second bending part 112c, the third housing assembly 160 rotates from the second side of the second connection housing 140 onto the second housing assembly 150 to overlap the second housing assembly 150. The third housing assembly 160 according to an embodiment, as illustrated in FIG. 10, may include a third panel supporting part 161, a third lower housing 163, and a third upper housing 165.

The third panel supporting part 161 supports a second area 112e of the display panel 110. A first side S1 of the third panel supporting part 163 is rotatably supported by the third lower housing 163 while moving, and a second side S2 parallel to the first side S1 is movably coupled to the second connection housing 140, and when the display panel 110 is unfolded, the second side S2 supports a second side of the second bending part 112c. The third panel supporting part 161 according to an embodiment includes a third plate 161a, a pair of second moving shafts 161b, and a pair of second rotation shafts 161c.

The third plate 161a is coupled to a second area (i.e., a second rear area) of the display panel 110, and overlaps the second side of the second bending part 112c. Here, a partial area of the third plate 161a overlapping the second rear area of the display panel 110 is physically coupled to the second rear area of the display panel 110 by an adhesive member. The other area of the third plate 161a overlapping the second side of the second bending part 112c is not physically coupled to the display panel 110 for bending of the second bending part 112c, and when the display panel 110 is unfolded, the other area of the third plate 161a supports the second side of the second bending part 112c.

Figure 11:
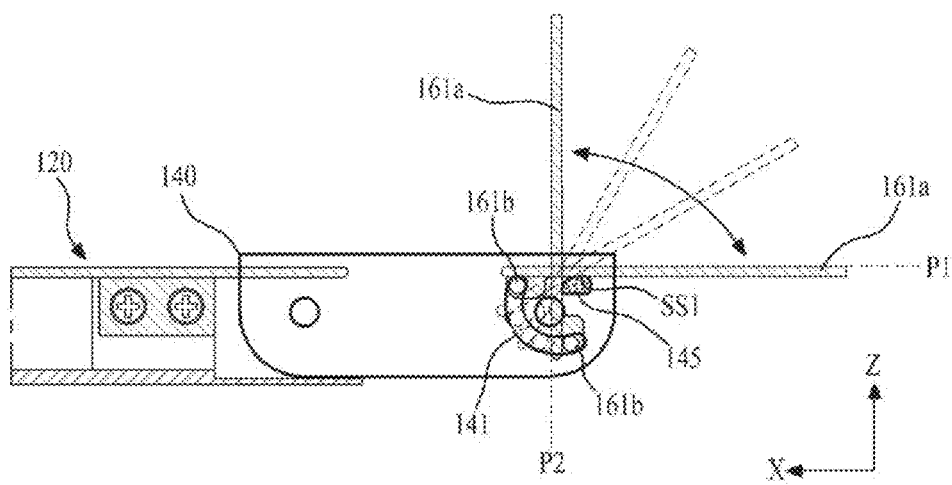
FIG. 11 is a diagram illustrating moving of a third plate by a second slot in the third housing assembly of FIG. 10.

The pair of second moving shafts 161b may protrude from a first side S1 of the third plate 161a (more particularly, a first side edge of a long side of the third plate 161a adjacent to the second connection housing 140) to have a certain length, and thus may be provided in a cylindrical shape. Each of the pair of second moving shafts 161b, as illustrated in FIG. 11, is movably inserted into the second slot 141 of the second connection housing 140. Each of the pair of second moving shafts 161b is slid in the second slot 141 according to rotation of the second housing assembly 150, and moves the first side S1 of the third plate 161a to a supporting position P1 or an avoiding position P2.

The pair of second rotation shafts 161c may protrude from a second side S1 of the third plate 161a (more particularly, a second side edge of the long side of the third plate 161a) to have a certain length, and thus may be provided in a cylindrical shape.

The second moving shaft 161b and the second rotation shaft 161c are not provided to protrude from the third plate 161a, and may be separate shaft members such as a pin or a shaft coupled to an edge of a long side of a corresponding third plate 161a.

When the display panel 110 is unfolded and folded, the third panel supporting part 161 swings with respect to the second rotation shaft 161c, and thus, a first side S1 of the third panel supporting part 161 is moved to a supporting position for supporting the second side of the second bending part 112c according to sliding of the second moving shaft 161b based on the movement guide of the second slot 141 which is provided at the second connection housing 140, or is moved to an avoiding position in order for the second bending part 112c to be bent in a curved shape.

The third lower housing 163 rotatably supports the second side S2 of the third panel supporting part 161, and covers a bottom of the third panel supporting part 161. The third lower housing 163 according to an embodiment includes a third lower cover 163a and a pair of second shaft supporting bodies 163b.

The third lower cover 163a is coupled to the third upper housing 165 by a coupling member (not shown) such as a screw, and covers a bottom of the third panel supporting part 161 and the second side of the second connection housing 140.

Each of the pair of second shaft supporting bodies 163b is coupled to a second side edge of the third lower cover 163a in parallel to overlap a corresponding second rotation shaft 161c which is provided at the third panel supporting part 161, and movably supports the corresponding second rotation shaft 161c. Each of the pair of second shaft supporting bodies 163b according to an embodiment includes a second shaft supporting groove 163b1 which supports the second rotation shaft 161c so as to rotate at a fixed position. Here, the second shaft supporting groove 163b1 may be recessed to have a semicircular cross-sectional surface, or may be provided as a hole into which the second rotation shaft 161c is inserted. The pair of second shaft supporting bodies 163b are coupled to the third lower cover 163a by a coupling member (not shown) such as a screw coupled to the third lower cover 163a through a second coupling hole 163b2 which is provided adjacent to the second shaft supporting groove 163b1, and rotatably supports the second rotation shaft 161c. Each of the pair of second shaft supporting bodies 163b supports the second rotation shaft 161c so as to rotate. Therefore the third panel supporting part 161 is slid along a trajectory of the second slot 141, and thus, the second bending part 112c is bent in a curved shape having a relatively greater curvature than that of the first bending part 112b, thereby reducing or dispersing a stress applied to the second area of the display panel 110, namely, the second bending part 112c.

The third upper housing 165 is coupled to the third lower housing 163, is rotatably coupled to a second side of the second connection housing 140, and covers an edge of the second area of the display panel 110 except the second bending part 112c. That is, the third upper housing 165 has a ⌈-shaped cross-sectional surface which includes a front cover part 165a and a side cover part 165b, has a ⊂-shape in plane, and surrounds a side of the third panel supporting part 161 and a peripheral area of the second area of the display panel 110 except the second bending part 112c.

A first side S1 of the third upper housing 165 is rotatably coupled to the second side of the second connection housing 140 by the fourth pivot shaft 177 (see FIG. 7). To this end, a second shaft inserting hole 165c is provided at the first side S1 of the third upper housing 165. A plurality of screw holes (not shown), which are coupled to a coupling member such as a screw passing through the third lower cover 163a of the third lower housing 163, are arranged at certain intervals at a bottom of the side cover part 165b of the third upper housing 165. Therefore, the third upper housing 165 may rotate by 0 degrees to 90 degrees from the second side of the second connection housing 140 with respect to the fourth pivot shaft 173. In addition, the third upper housing 165 covers an upper portion of the second rotation shaft 161c supported by the second shaft supporting body 163b, and thus prevents the second rotation shaft 161c from deviating from the second shaft supporting body 163b.

As the first side S1 of the third panel supporting part 161 is supported by the second supporting member 145, a space is provided between the third lower housing 163 and the third panel supporting part 161, and may be used as an accommodating space.

Figure 12:
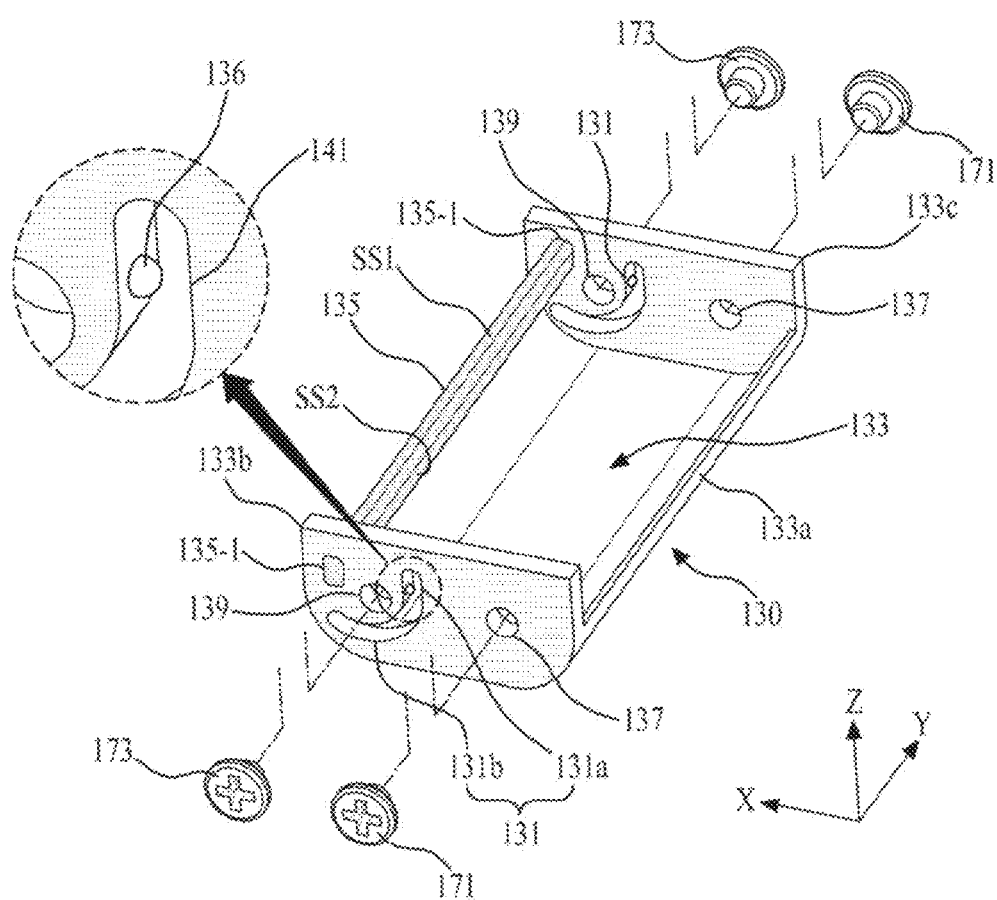
FIG. 12 is a diagram for describing a modification example of a first connection housing according to an embodiment of the present invention.
Figure 13:
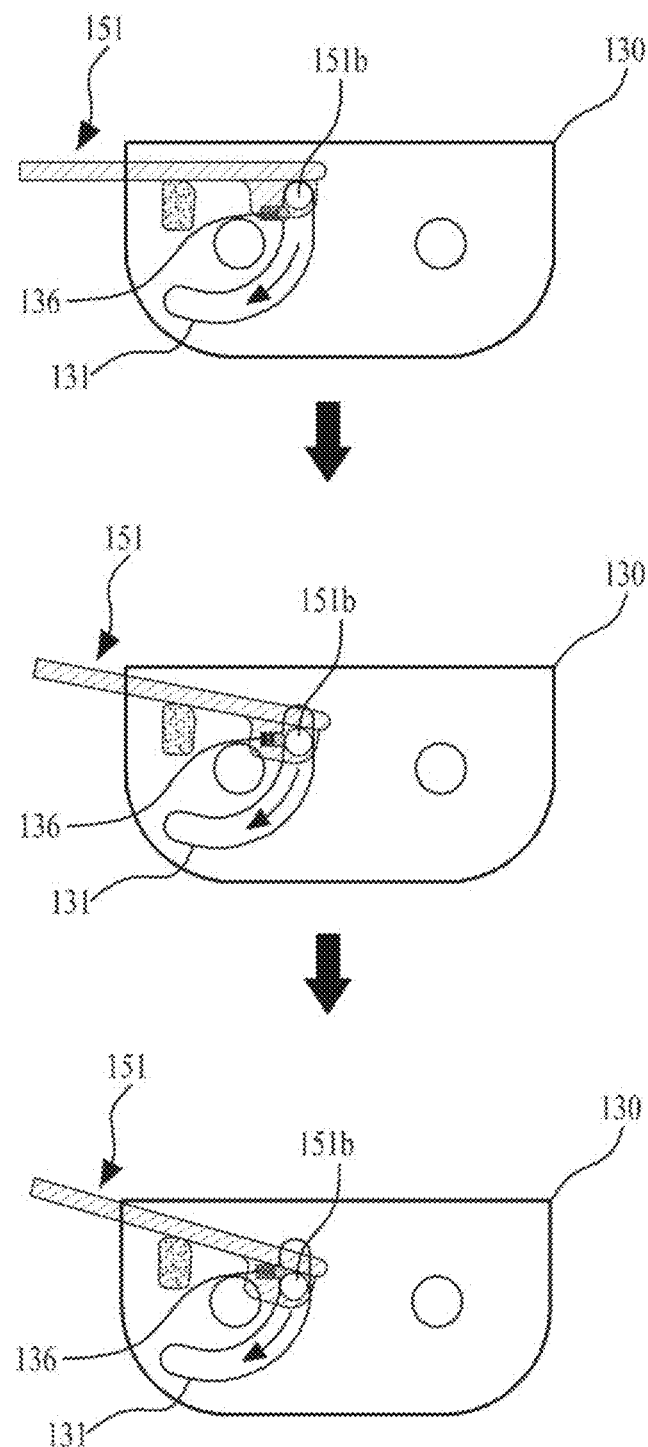
FIG. 13 is a diagram sequentially illustrating an example of the operations of a movement binding member illustrated in FIG. 12.

FIG. 12 is a diagram for describing a modification example of a first connection housing according to an embodiment of the present invention, and FIG. 13 is a diagram sequentially illustrating operations of a movement binding member illustrated in FIG. 12. Here, a first movement binding member is additionally provided in the first slot of FIG. 5 or 6. Thus, in the following description, only the first movement binding member will be described.

Referring to FIGS. 12 and 13, the first movement binding member 136 is provided at a guide surface of the first slot 131, and selectively binds moving of the first side S1 of the second panel supporting part 151 from the supporting position P1 to the avoiding position P2. For example, the first movement binding member 136 may include a ball spring that enables the first moving shaft 151b of the second panel supporting part 151 to be down-slid along the first slot 131 by using compression of a spring by an applied pressure. That is, when a bending force equal to or greater than a certain force is applied to the unfolded display panel 110, the first moving shaft 151b of the second panel supporting part 151 pushes a ball toward the spring, and is down-slid along the first slot 131. Therefore, the first movement binding member 136 prevents the first area of the display panel 110, which is unfolded to a plane state, from being folded by a bending force equal to or less than a certain force.

Likewise, the foldable display apparatus according to an embodiment of the present invention may further include a second movement binding member (not shown) which is provided at the second slot 141 of the second connection housing 140. The second movement binding member is provided at a guide surface of the second slot 141, and selectively binds moving of the first side S1 of the third panel supporting part 161 from the supporting position P1 to the avoiding position P2. The second movement binding member may include a ball spring that enables the second moving shaft 161b of the third panel supporting part 161 to be down-slid along the second slot 141 by using compression of a spring by a pressure which is applied identically to the first movement binding member 136. Therefore, the second movement binding member prevents the second area of the display panel 110, which is unfolded to a plane state, from being folded by a bending force equal to or less than a certain force.

Figure 14A:
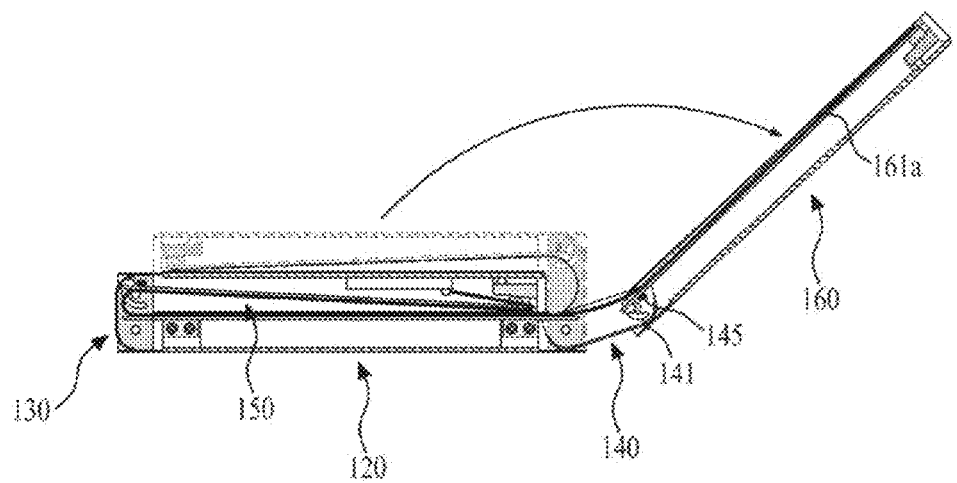
FIGS. 14A and 14B are diagrams schematically illustrating a process in which a two-stage-folded display panel illustrated in FIG. 2 is unfolded to a plane state.
Figure 14B:
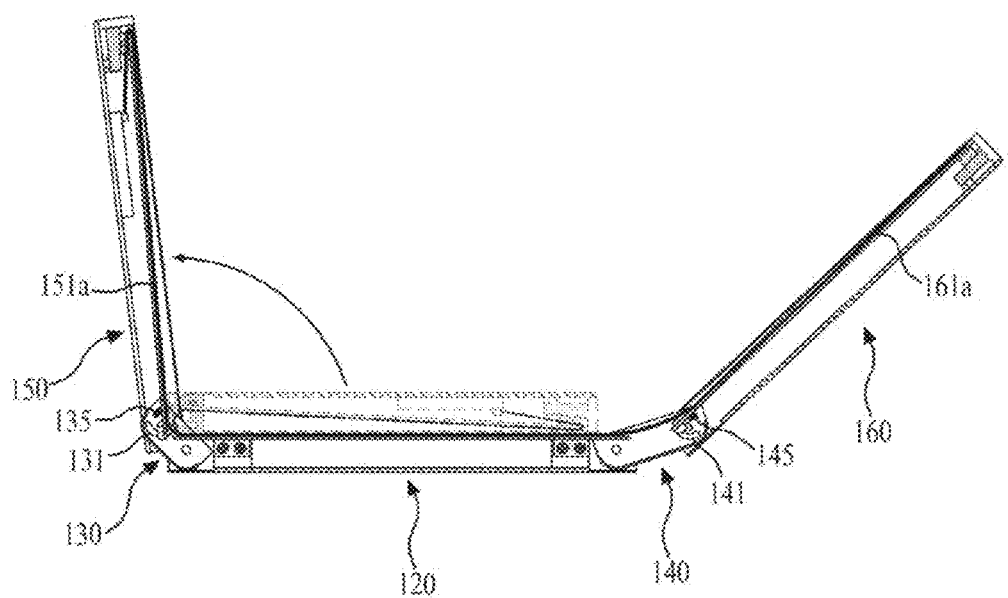

FIGS. 14A and 14B are diagrams schematically illustrating a process in which a two-stage-folded display panel illustrated in FIG. 2 is unfolded to a plane state.

As illustrated in FIG. 12, the display panel 110 according to an embodiment of the present invention is folded at one stage when the second housing assembly 150 is overlapped onto the first housing assembly 120 by rotation of each of the first connection housing 130 and the second housing assembly 150. At this time, the first bending part 112b of the display panel 110 is bent in a curved shape having a first curvature and between the first side of the first plate 121a and the second side of the second plate 151a moved to the avoiding position according to movement guide by the first slot 131, and is accommodated in the accommodating part of the first connection housing 130. That is, as the second side S2 of the second plate 151a is rotated to be inclined toward the second lower cover 153 with respect to the first rotation shaft 151c, the first side S1 of the second plate 151a retreats from the supporting position to the second lower cover 153 according to movement guide by the first slot 131 so as not to prevent bending of the first bending part 112b.

Subsequently, the display panel 110 according to an embodiment of the present invention is folded at two stages when the third housing assembly 160 is overlapped onto the second housing assembly 150 by rotation of each of the second connection housing 140 and the third housing assembly 160. At this time, the second bending part 112c of the display panel 110 is bent in a curved shape having a second curvature greater than the first curvature and between the second side of the first plate 121a and the second side of the third plate 161a moved to the avoiding position according to movement guide by the second slot 141, and is accommodated in the accommodating part of the second connection housing 140. That is, as the second side S2 of the third plate 161a is rotated to be inclined toward the third lower cover 163 with respect to the second rotation shaft 161c, the first side S1 of the third plate 161a retreats from the supporting position to the third lower cover 163 according to movement guide by the second slot 141 so as not to prevent bending of the second bending part 112c.

Subsequently, as illustrated in FIG. 14A, in the display panel 110 according to an embodiment of the present invention, the third housing assembly 160 is unfolded to a plane state on the second housing assembly 150 according to rotation of each of the second connection housing 140 and the third housing assembly 160. At this time, the second bending part 112c of the display panel 110 is supported by the second side of the first plate 121a and the second side of the third plate 161a moved from the avoiding position to the supporting position according to movement guide by the second slot 141. That is, when the third housing assembly 160 rotates in a horizontal state, the first side of the third plate 161a is up-slid to the supporting position along the second slot 141 of the second connection housing 140, and is supported by the second supporting member 145. Therefore, the second bending part 112c unfolded to a plane state is stably supported by the first side of the third plate 161a and the second side of the first plate 121a, and thus prevents the second bending part 112c of the display panel 110 from being recessed by an external force, thereby maintaining the unfolded display panel 110 in a plane state.

Subsequently, as illustrated in FIG. 14B, in the display panel 110 according to an embodiment of the present invention, the second housing assembly 150 is unfolded to a plane state on the first housing assembly 120 according to rotation of each of the first connection housing 130 and the second housing assembly 150. At this time, the first bending part 112b of the display panel 110 is supported by the first side of the first plate 121a and the second side of the second plate 151a moved from the avoiding position to the supporting position according to movement guide by the first slot 131. That is, when the second housing assembly 140 rotates in a horizontal state, the first side of the second plate 151a is up-slid to the supporting position along the first slot 131 of the first connection housing 130, and is supported by the first supporting member 135. Therefore, the first bending part 112b unfolded to a plane state is stably supported by the first side of the second plate 151a and the first side of the first plate 121a, and thus prevents the first bending part 112b of the display panel 110 from being recessed by an external force, thereby maintaining the unfolded display panel 110 in a plane state.

As described above, one or more embodiments of the present invention fold the display panel at two stages with respect to the first and second bending parts, thereby reducing a size of a folded display apparatus. Also, one or more embodiments of the present invention stably support the first and second bending parts of an unfolded display panel, and thus prevent the first and second bending parts of the unfolded display panel from being recessed by an external force, thereby maintaining the unfolded display panel in a plane state. Also, one or more embodiments of the present invention bend the first and second bending parts at a predetermined curvature when the display panel is folded, and thus minimize a bending stress applied to the bending part, thereby preventing a reliability of the foldable display apparatus from being reduced due to the bending stress.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display apparatus comprising:
   a display panel unfolded or folded at two stages with respect to first and second bending parts which are defined in a display area displaying an image;
   a first housing assembly to include a first panel supporting part which supports a central portion of the display panel between the first and second bending parts;
   a second housing assembly to include a second panel supporting part which supports a first side of the display panel;
   a third housing assembly to include a third panel supporting part which supports a second side of the display panel;
   a first connection housing connected between the second housing assembly and a first side of the first housing assembly to overlap the first bending part, and to include a first slot which guides movement of a first side of the second panel supporting part; and a second connection housing connected between the third housing assembly and a second side of the first housing assembly to overlap the second bending part, and to include a second slot which guides movement of a first side of the third panel supporting part, wherein the second housing assembly comprises:

a second lower housing; and a second upper housing coupled to the second lower housing, connected to the first connection housing, and to cover an edge of a first area of the display panel except the first bending part, wherein the second panel supporting part comprises:

a second plate coupled to a first area rear surface of the display panel;

a first moving shaft provided at a first side of the second plate, and inserted into the first slot; and a first rotation shaft supported by the second lower housing, and wherein the second lower housing comprises:

a second lower cover coupled to the second upper housing to cover a rear surface of the second panel supporting part and a second side of the first connection housing; and a first shaft supporting body provided at the second lower cover, and to movably support the first rotation shaft.

2. The foldable display apparatus of claim 1, wherein the first housing assembly comprises:

the first panel supporting part configured to include a first plate which is coupled to a central rear surface of the display panel between the first and second bending parts;

a first lower housing configured to include a first lower cover which covers a rear surface of the first panel supporting part, a first side of the first connection housing, and a first side of the second connection housing; and a pair of first upper housings coupled to the first lower cover and the first plate, and configured to cover both central edges of the display panel except the first and second bending parts, wherein a first side of each of the pair of first upper housings is connected to the first side of the first connection housing, and a second side of each of the pair of first upper housings is connected to the first side of the second connection housing.

3. The foldable display apparatus of claim 1, wherein the first connection housing further comprises:

a first accommodating part configured to accommodate the first bending part which is bent in a curved shape, and wherein the second connection housing comprises:

a second accommodating part configured to accommodate the second bending part which is bent in a curved shape.

4. The foldable display apparatus of claim 3, wherein, the first connection housing further comprises a first supporting member configured to support a first side of the second panel supporting part which is moved along the first slot, and the second connection housing further comprises a second supporting member configured to support a first side of the third panel supporting part which is moved along the second slot.

5. The foldable display apparatus of claim 1, wherein the first slot comprises:

a vertical slot provided along a vertical direction vertical to a length direction of the display panel; and a curved slot connected to the vertical slot in a curved shape, wherein the first side of the second plate is moved in the curved slot, and wherein a second side of the second plate is slid in the length direction of the display panel when the first rotation shaft is moved at the first shaft supporting body.

6. The foldable display apparatus of claim 4, wherein the third housing assembly comprises:

a third lower housing;

the third panel supporting part configured to include a first side supported by the second slot, and a second side supported by the third lower housing; and a third upper housing coupled to the third lower housing, connected to the second connection housing, and configured to cover an edge of a second area of the display panel except the second bending part, and wherein the third panel supporting part comprises:

a third plate coupled to a second area rear surface of the display panel;

a second moving shaft provided at a first side of the third plate, and inserted into the second slot; and a second rotation shaft supported by the third lower housing.

7. The foldable display apparatus of claim 6, wherein the third lower housing comprises:

a third lower cover coupled to the third upper housing to cover a rear surface of the third panel supporting part and a second side of the second connection housing; and a second shaft supporting body provided at the third lower cover, and configured to support the second rotation shaft.

8. The foldable display apparatus of claim 7, wherein the second slot is provided in a curved shape, wherein a first side of the third plate is moved in the second slot, and wherein a second side of the third plate rotates with respect to the second rotation shaft fixed to the second shaft supporting body.

9. The foldable display apparatus of claim 3, wherein, the first connection housing further comprises a first movement binding member provided at the first slot, and configured to selectively bind moving of a first side of the second panel supporting part, and the second connection housing further comprises a second movement binding member provided at the second slot, and configured to selectively bind moving of a first side of the third panel supporting part.

10. The foldable display apparatus of claim 9, wherein each of the first and second movement binding members comprises a ball spring.

11. A foldable display apparatus comprising:

a display panel unfolded or folded at two stages with respect to first and second bending parts which are defined in a display area for displaying an image;

a first housing assembly to include a first panel supporting part which supports a central portion of the display panel between the first and second bending parts;

a second housing assembly to include a second panel supporting part which supports a first side of the display panel;

a third housing assembly to include a third panel supporting part which supports a second side of the display panel;

a first connection housing connected to between the second housing assembly and a first side of the first housing assembly to overlap the first bending part, and to include a first slot which guides movement of a first side of the second panel supporting part; and a second connection housing connected to between the third housing assembly and a second side of the first housing assembly to overlap the second bending part, and to include a second slot which guides movement of a first side of the third panel supporting part, wherein the first connection housing further comprises a first movement binding member provided at the first slot, and to selectively bind moving of the first side of the second panel supporting part, wherein the second connection housing further comprises a second movement binding member provided at the second slot, and to selectively bind moving of the first side of the third panel supporting part, and wherein each of the first and second movement binding members comprises a ball spring.

* * * * *